US007595703B2

(12) United States Patent
Fujiwara et al.

(10) Patent No.: US 7,595,703 B2
(45) Date of Patent: Sep. 29, 2009

(54) BALUN AND ELECTRONIC DEVICE USING THIS

(75) Inventors: Joji Fujiwara, Osaka (JP); Michiaki Tsuneoka, Osaka (JP)

(73) Assignee: Panasonic Corporation, Osaka (JP)

( * ) Notice: Subject to any disclaimer, the term of this patent is extended or adjusted under 35 U.S.C. 154(b) by 153 days.

(21) Appl. No.: 11/915,601

(22) PCT Filed: Jan. 24, 2007

(86) PCT No.: PCT/JP2007/051054

§ 371 (c)(1),
(2), (4) Date: Nov. 27, 2007

(87) PCT Pub. No.: WO2007/086405

PCT Pub. Date: Aug. 2, 2007

(65) Prior Publication Data

US 2009/0079512 A1 Mar. 26, 2009

(30) Foreign Application Priority Data

Jan. 25, 2006 (JP) ............................ 2006-015904

(51) Int. Cl.
*H03H 7/42* (2006.01)
*H01P 3/08* (2006.01)

(52) U.S. Cl. ........................................ 333/26; 333/238

(58) Field of Classification Search ................... 333/25, 333/26, 238
See application file for complete search history.

(56) References Cited

U.S. PATENT DOCUMENTS 6,018,277 A * 1/2000 Vaisanen ..................... 333/26
7,157,986 B1 * 1/2007 Wu et al. ....................... 333/26
7,256,663 B2 * 8/2007 Yasuda et al. ................. 333/26

FOREIGN PATENT DOCUMENTS

JP 09-260145 A 10/1997
JP 2002-190413 A 7/2002
JP 2002-359507 A 12/2002
JP 2004-056745 A 2/2004

OTHER PUBLICATIONS

International Search Report for Application No. PCT/JP2007/051054, dated May 1, 2007.

* cited by examiner

*Primary Examiner*—Dean O Takaoka
(74) *Attorney, Agent, or Firm*—RatnerPrestia

(57) ABSTRACT

A balun is provided in which first balanced line and second balanced line are disposed on a nearly the same plane, first unbalanced line is disposed above first balanced line at a predetermined distance from first balanced line, second unbalanced line is disposed below second balanced line at the predetermined distance from second balanced line. With this configuration, the distance between first unbalanced line and second unbalanced line can be increased thereby greatly suppressing mutual cancellation of a current flowing in first unbalanced line and a current flowing in second unbalanced line.

3 Claims, 4 Drawing Sheets

BALUN AND ELECTRONIC DEVICE USING THIS

This application is a U.S. National Phase Application of PCT International Application PCT/JP2007/051054.

TECHNICAL FIELD

The present invention relates to a balun for converting an unbalanced signal to a balanced signal and to electronic apparatuses such as portable terminals using the balun.

BACKGROUND ART

Description of a conventional balun will be given in the following referring to FIG. 4, FIG. 5, and FIG. 6.

FIG. 4 is a circuit diagram of a conventional balun. In FIG. 4, conventional balun 1 comprises input terminal 2, coupled line 3 connected to input terminal 2, and first output terminal 4 and second output terminal 5 connected to coupled line 3.

Additionally, first capacitor 6 is connected between input terminal 2 and coupled line 3 in shunt with ground. Also, the lines from coupled lines 3 to first output terminal 4 and from coupled line 3 to second output terminal 5 are RF-coupled through second capacitor 7.

Also, coupled line 3 includes first unbalanced line 8 connected to input terminal 2, and second unbalanced line 9 connected between first unbalanced line 8 and ground. Furthermore, coupled line 3 includes first balanced line 10 connected between ground and first output terminal 4 and electromagnetically coupled to first unbalanced line 8, and second balanced line 11 connected between ground and second output terminal 5 and electromagnetically coupled to second unbalanced line 9.

FIG. 5 is a sectional view of a conventional balun. In FIG. 5, conventional balun 1 includes first dielectric layer 12 and second dielectric layer 13 on top of first dielectric layer 12. First unbalanced line 8 and second unbalanced line 9 are disposed on the same plane on top of second dielectric layer 13. Furthermore, first balanced line 10 and second balanced line 11 are disposed on the same plane on top of first dielectric layer 12 under first unbalanced line 8 and second unbalanced line 9, respectively, through second dielectric layer 13.

FIG. 6 is a perspective view of a coupled line of a conventional balun. As can be seen in FIG. 6, first unbalanced line 8 and second unbalanced line 9 are connected by folding back. Size reduction of balun 1 is achieved with this design.

As a related art document relating to the invention of this application, Patent Document 1 is known, for example:

Patent Document 1: Japanese Unexamined Patent Application Publication No. 2002-190413.

However, as first unbalanced line 8 and second unbalanced line 9 are connected by folding back, first unbalanced line 8 and second unbalanced line 9 come close to each other. As a result, the current of a radio frequency signal propagating in first unbalanced line 8 and the current of a radio frequency signal propagating in second unbalanced line 9 cancel each other thus resulting in attenuation of balanced signals obtained from first output terminal 4 and second output terminal 5 of balun 1 when compared with an unbalanced signal inputted to input terminal 2 of conventional balun 1.

SUMMARY OF THE INVENTION

The present invention provides a balun in which, when a first unbalanced line and a second unbalanced line are connected by folding back, attenuation of a balanced signal output from the output terminal is suppressed compared with an unbalanced signal inputted to the input terminal.

The balun in accordance with the present invention includes an input terminal, a coupled line connected to the input terminal, and a first output terminal and a second output terminal connected to the coupled line. And the coupled line includes a first unbalanced line connected to the input terminal, a second unbalanced line connected to the first unbalanced line by folding back with its free end connected to ground, a first balanced line connected between ground and the first output terminal, and a second balanced line connected between ground and the second output terminal. Also, the first balanced line and the second balanced line are disposed substantially on the same plane. The first unbalanced line is disposed above the first balanced line at a predetermined distance from the first balanced line. The second unbalanced line is disposed below the second balanced line at the predetermined distance from the second balanced line.

With this configuration, the distance between the first unbalanced line and the second unbalanced line is increased thereby suppressing a current flowing in the first unbalanced line and a current flowing in the second unbalanced line from greatly cancelling with each other. As a result, when the first unbalanced line and the second unbalanced line are connected by folding back, attenuation of a balanced signal outputted from the output terminal can be suppressed compared with the unbalanced signal inputted to the input terminal.

REFERENCE MARKS IN THE DRAWINGS

Figure 1A:
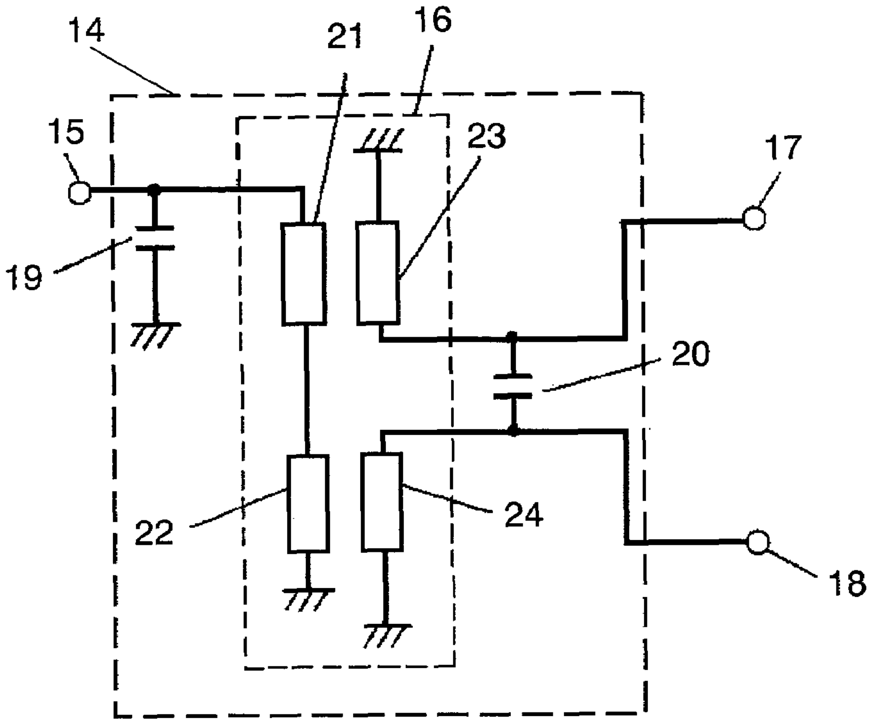
FIG. 1A is a circuit diagram of a balun in a first exemplary embodiment of the present invention.

14 Balun
15 Input terminal
16 Coupled line
17 First output terminal
18 Second output terminal
21 First unbalanced line
22 Second unbalanced line
23 First balanced line
24 Second balanced line
100 Electronic apparatus
101 BPF (bandpass filter)
102 RF circuit
103 Demodulator
104 Display
105 Antenna

DETAILED DESCRIPTION OF EXEMPLARY EMBODIMENTS

First Exemplary Embodiment

Referring to FIG. 1A, FIG. 1B, FIG. 2, and FIG. 3, description of the first exemplary embodiment will be given below.

FIG. 1A is a circuit diagram of a balun in the first exemplary embodiment of the present invention. In FIG. 1A, balun 14 includes input terminal 15, coupled line 16 connected to input terminal 15, and first output terminal 17 and second output terminal 18 connected to an output side of coupled line 16. First capacitor 19 is connected between input terminal 15 and coupled line 16 in shunt with ground. Also, the lines between coupled line 16 and first output terminal 17 and between coupled line 16 and second output terminal 18 are RF (radio frequency)-coupled through second capacitor 20.

Also, coupled line 16 includes first unbalanced line 21 connected to input terminal 15 and second unbalanced line 22 connected between first unbalanced line 21 and ground. Furthermore, coupled line 16 includes first balanced line 23 connected between ground and first output terminal 17 and electromagnetically coupled to first unbalanced line 21, and second balanced line 24 connected between ground and second output terminal 18 and electromagnetically coupled to second unbalanced line 22.

Each of first unbalanced line 21, second unbalanced line 22, first balanced line 23, and second balanced line 24 is of a length equal to odd number multiples of nearly quarter-wavelength of the respective input/output signals. Generally, the length is nearly quarter-wavelength of the input/output signals for the purpose of miniaturization.

In the above configuration, balun 14 converts an unbalanced signal inputted at input terminal 15 into a balanced signal which is reversed in phase and equal in amplitude, and outputs the balanced signal from first output terminal 17 and second output terminal 18.

Figure 1B:
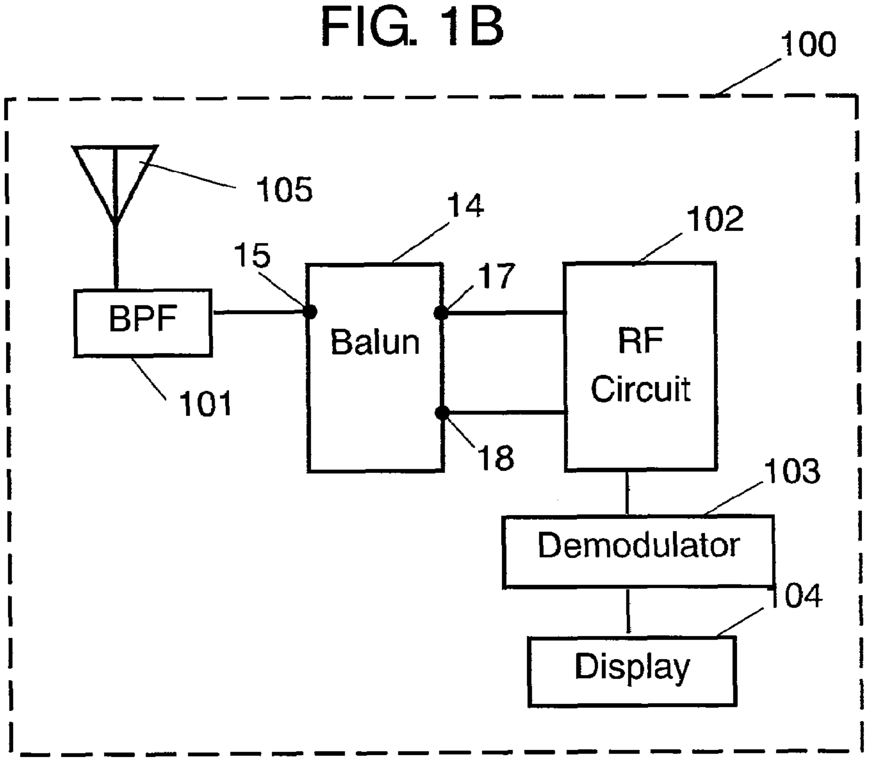
FIG. 1B is a block diagram of an electronic apparatus that uses a balun in the first exemplary embodiment of the present invention.

FIG. 1B is a block diagram of an electronic apparatus that uses a balun in accordance with the first exemplary embodiment of the present invention. Electronic apparatus 100 using balun 14 is a television receiver. The television receiver includes RF circuit 102 connected to output sides of first output terminal 17 and second output terminal 18, demodulator 103 connected to an output side of RF circuit 102, and display 104 connected to an output side of demodulator 103. An output signal from antenna 105 is inputted to input terminal 15 through BPF 101.

RF circuit 102 is implemented as an integrated circuit for the sake of miniaturization. Also, display 104 is configured with components including CRT, LCD, PDP.

Figure 2:
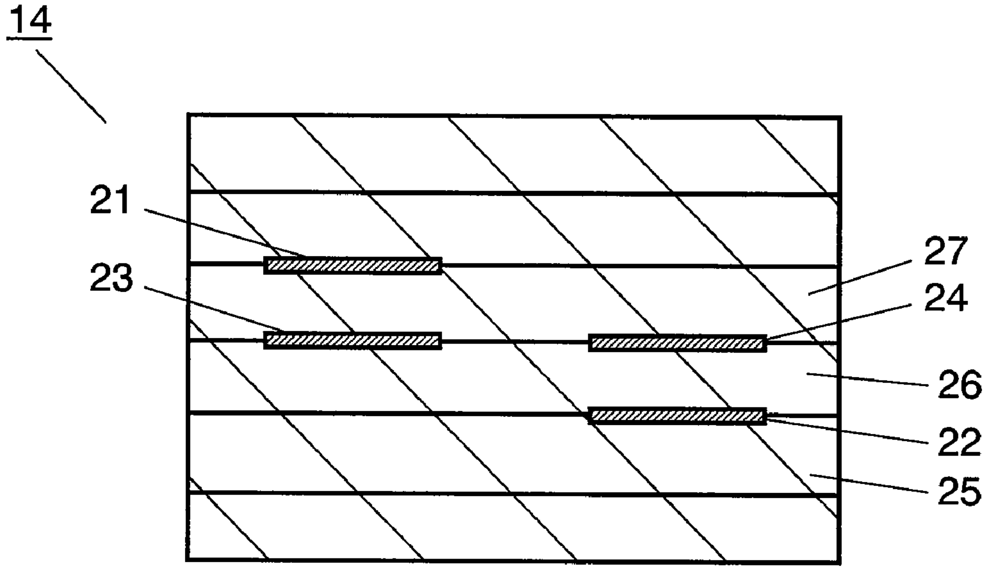
FIG. 2 is a sectional view of a balun in the first exemplary embodiment of the present invention.

FIG. 2 is a sectional view of a balun in the first exemplary embodiment of the present invention. In FIG. 2, balun 14 includes first dielectric layer 25, second dielectric layer 26 on top of first dielectric layer 25, and third dielectric layer 27 on top of second dielectric layer 26. First balanced line 23 and second balanced line 24 are disposed on the same plane on second dielectric layer 26. Accordingly, the distance between first balanced line 23 and a shield pattern (not shown) and the distance between second balanced line 24 and the shield pattern, for example, are made nearly equal, and uniformity of the amplitude of a signal to be outputted from first balanced line 23 and the amplitude of a signal to be outputted from second balanced line 24 can be enhanced.

Furthermore, first unbalanced line 21 is disposed on third dielectric layer 27 and above first balanced line 23 at a predetermined distance d from first balanced line 23. Also, second unbalanced line 22 is disposed on first dielectric layer 25 and below second balanced line 24 at the predetermined distance d from second balanced line 24. Though attenuation of a balanced signal can be suppressed by choosing a larger value of d, it is not appropriate for miniaturization. With the balun in accordance with the present application, the d-value chosen is in the range 0.1 mm to 0.2 mm for optimization of attenuation suppression of the balanced signal and miniaturization.

Figure 3:
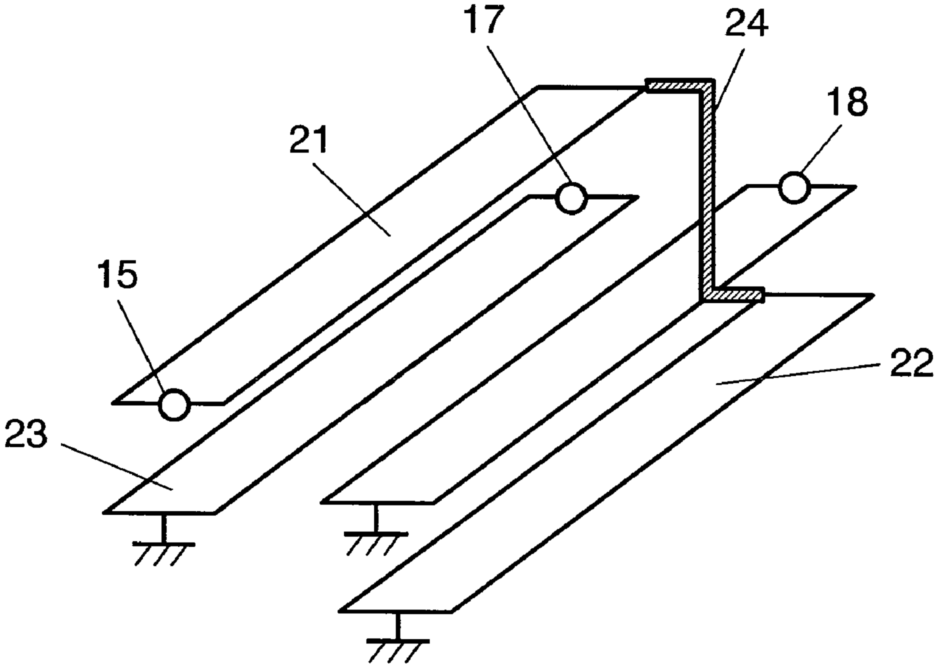
FIG. 3 is a perspective view of a coupled line of a balun in the first exemplary embodiment of the present invention.
Figure 4:
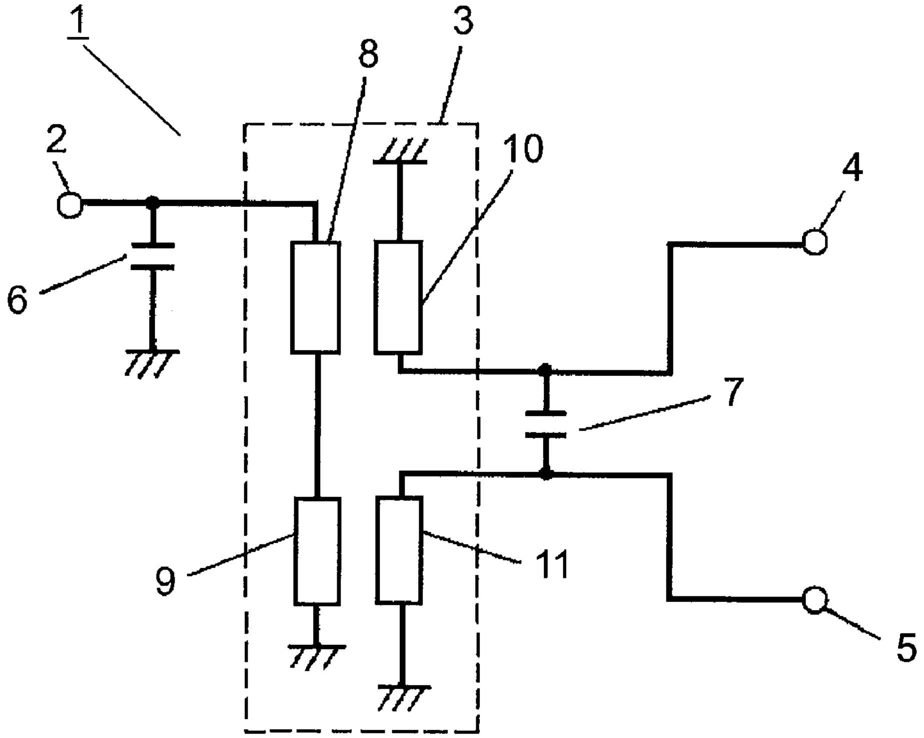
FIG. 4 PRIOR ART
FIG. 4 is a circuit diagram of a conventional balun.
Figure 5:
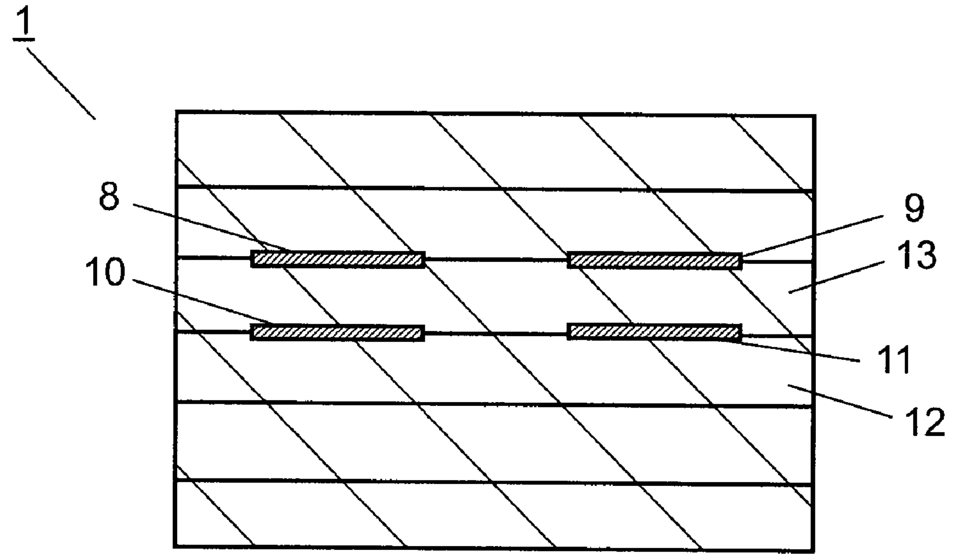
FIG. 5 PRIOR ART
FIG. 5 is a sectional view of a conventional balun.
Figure 6:
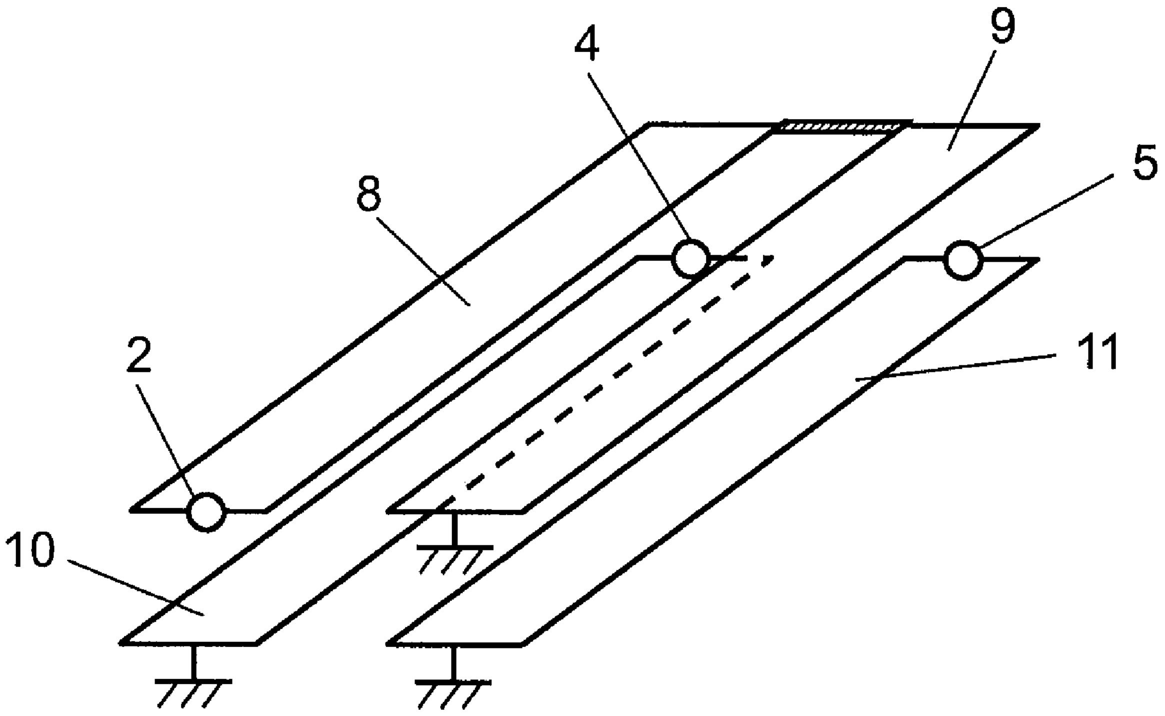
FIG. 6 PRIOR ART
FIG. 6 is a perspective view of a coupled line of a conventional balun.

FIG. 3 is a perspective view of a coupled line of a balun in the first exemplary embodiment of the present invention. As shown in FIG. 3, first unbalanced line 21 and second unbalanced line 22 are connected by folding back. Further miniaturization of balun 14 is intended with this.

By adopting the above configuration, the distance between first unbalanced line 21 and second unbalanced line 22 is increased thus greatly suppressing mutual cancellation of the current flowing in first unbalanced line 21 and the current flowing in second unbalanced line 22. As a result, when first unbalanced line 21 and second unbalanced line 22 are connected by folding back, the attenuation of balanced signals outputted from output terminals 17, 18 can be suppressed compared with an unbalanced signal inputted to input terminal 15.

Here, it is preferable that the widths of first unbalanced line 21 and second unbalanced line 22 be greater than the widths of first balanced line 23 and second balanced line 24. With this, the input impedance of balun 14 can be made smaller than the output impedance of balun 14. As a result, impedance matching between balun 14 and an RF circuit connected to the output side of balun 14 can be made easier.

INDUSTRIAL APPLICABILITY

When a first unbalanced line and a second unbalanced line are connected by folding back, the balun in accordance with the present invention can suppress attenuation of a balanced signal to be outputted from the output terminal compared with an unbalanced signal inputted at the input terminal, thus lending itself to electronic apparatuses such as portable terminals and broadcast receivers.

The invention claimed is:

1. A balun comprising:

an input terminal, a coupled line connected to the input terminal, and a first output terminal and a second output terminal connected to the coupled line, the coupled line including:

a first unbalanced line connected to the input terminal, a second unbalanced line connected to the first unbalanced line by folding back with an open end connected to ground, a first balanced line connected between the ground and the first output terminal, a second balanced line connected between the ground and the second output terminal; wherein the first balanced line and the second balanced line are disposed substantially on the same plane, the first unbalanced line is disposed above the first balanced line at a predetermined distance from the first balanced line, and the second unbalanced line is disposed below the second balanced line at the predetermined distance from the second balanced line.

2. The balun of claim 1, wherein the width of the first unbalanced line and the width of the second unbalanced line are greater than the widths of the first balanced line and the second balanced line.

3. An electronic apparatus comprising:

an antenna, an input terminal connected to an output side of the antenna, a coupled line connected to the input terminal, a first output terminal and a second output terminal connected to the coupled line, an RF circuit connected to output sides of the first output terminal and the second output terminal, a demodulator connected to an output side of the RF circuit, and, a display connected to an output side of the demodulator; the coupled line including:

a first unbalanced line connected to the input terminal, a second unbalanced line connected to the first unbalanced line by folding back with a free end connected to ground, a first balanced line connected between the ground and the first output terminal, a second balanced line connected between the ground and the second output terminal, wherein:

the first balanced line and the second balanced line are disposed on substantially the same plane, the first unbalanced line is disposed above the first balanced line at a predetermined distance from the first balanced line, and the second unbalanced line is disposed below the second balanced line at the predetermined distance from the second balanced line.

* * * * *